United States Patent
Ding et al.

(10) Patent No.: US 9,217,769 B2
(45) Date of Patent: Dec. 22, 2015

(54) RING OSCILLATOR TESTING WITH POWER SENSING RESISTOR

(71) Applicant: International Business Machines Corporation, Armonk, NY (US)

(72) Inventors: Hanyi Ding, Colchester, VT (US); Kai D. Feng, Hopewell Junction, NY (US); Hailing Wang, Essex Junction, VT (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/647,719

(22) Filed: Oct. 9, 2012

(65) Prior Publication Data

US 2014/0097858 A1 Apr. 10, 2014

(51) Int. Cl.
*G01R 31/00* (2006.01)
*G01R 31/28* (2006.01)
*H03K 3/03* (2006.01)

(52) U.S. Cl.
CPC .......... *G01R 31/2824* (2013.01); *H03K 3/0315* (2013.01)

(58) Field of Classification Search
CPC ........ G01R 31/2824; G01R 31/2851–31/2858; G01R 31/2882–31/2884; H03K 3/0315–3/0322
USPC ................... 324/750.01, 750.3, 76.23, 76.11, 324/76.39–76.77; 333/24 R; 331/44, 57, 74, 331/187
See application file for complete search history.

(56) References Cited

U.S. PATENT DOCUMENTS

| | | | |
|---|---|---|---|
| 6,075,417 A | 6/2000 | Cheek et al. | |
| 6,211,663 B1* | 4/2001 | Moulthrop et al. | 324/76.23 |
| 6,445,253 B1* | 9/2002 | Talbot | 331/57 |
| 6,690,241 B2 | 2/2004 | Ooishi et al. | |
| 7,765,445 B2 | 7/2010 | Eckelman et al. | |
| 2003/0107393 A1* | 6/2003 | Bourdin et al. | 324/765 |
| 2007/0126515 A1 | 6/2007 | Malik | |
| 2009/0125258 A1* | 5/2009 | Agarwal et al. | 702/75 |
| 2009/0210760 A1 | 8/2009 | Eckelman et al. | |
| 2010/0102890 A1 | 4/2010 | Stratz et al. | |

(Continued)

FOREIGN PATENT DOCUMENTS

EP 1967860 9/2008
JP 2003023055 1/2003

(Continued)

OTHER PUBLICATIONS

Machine Translation of JP 2012019469.*

(Continued)

*Primary Examiner* — Hoai-An D Nguyen
*Assistant Examiner* — Lee Rodak
(74) *Attorney, Agent, or Firm* — Cantor Colburn LLP; Steven Meyers

(57) ABSTRACT

A test circuit for a ring oscillator comprising a plurality of inverting stages includes a power supply, the power supply configured to provide a voltage to the plurality of inverting stages of the ring oscillator at a power output; and a power sensing resistor located between the power output of the power supply and direct current (DC) bias inputs of the inverting stages of the ring oscillator, wherein a signal from the power sensing resistor is configured to be monitored to determine a characteristic of the ring oscillator.

16 Claims, 5 Drawing Sheets

(56) References Cited

U.S. PATENT DOCUMENTS

2010/0253382 A1 10/2010 Wang et al.
2011/0140811 A1* 6/2011 Leiba et al. .................. 333/24 R

FOREIGN PATENT DOCUMENTS

JP      2012019469 A * 1/2012
KR     2007073274     7/2007

OTHER PUBLICATIONS

Annonymous; "PMOS and NMOS Process Monitors for Fast In-Test High Volume Manufacturing Process"; Feb. 15, 2007; IP.com No. IPCOM000146524D.

IBM; "Apparatus and Methodology for Test-Time Reduction for Ring Oscillator Measurements"; Jun. 10, 2009; IP.com No. IPCOM000184081D.

* cited by examiner

RING OSCILLATOR TESTING WITH POWER SENSING RESISTOR

BACKGROUND

This disclosure relates generally to ring oscillator circuits, and more particularly to testing of a ring oscillator with a power sensing resistor.

Ring oscillators are analog circuits including of an odd number of inverting stages connected in series that may be used for timing purposes. A ring oscillator may be designed to have a particular frequency of oscillation, and may be attached to chip input/output (I/O) or embedded in chip circuitry to make the ring oscillator system-accessible for various purposes in a computing system.

In order to test a ring oscillator, off-chip analog test equipment may be used to measure the frequency of the ring oscillator. However, use of analog test equipment for ring oscillator testing may be relatively inaccurate and inefficient, especially for ring oscillators having a frequency in a relatively high range, due to the loading effect of test buffers that are inserted into the ring oscillator during such testing. For example, a test buffer may be connected at the ring oscillator output, and additional test buffers may be added at the output of each inverting stage of the ring oscillator to determine characteristics of the individual inverting stages. The presence of the test buffers may introduce a significant load on the ring oscillator, rendering the testing of the ring oscillator inaccurate. Such ring oscillator testing disturbs the ring oscillator by adding extra load to the ring oscillator circuit, which slows down the oscillating frequency and stage delay of the ring oscillator. Inaccurate testing results cause difficulty in correlation of the impact of ring oscillator manufacturing process parameters to ring oscillator performance.

SUMMARY

In one aspect, a test circuit for a ring oscillator comprising a plurality of inverting stages includes a power supply, the power supply configured to provide a voltage to the plurality of inverting stages of the ring oscillator; and a power sensing resistor located between the power output of the power supply and direct current (DC) bias inputs of the inverting stages of the ring oscillator, wherein a signal from the power sensing resistor is configured to be monitored to determine a characteristic of the ring oscillator.

In another aspect, a method of testing a ring oscillator comprising a plurality of inverting stages includes connecting a power sensing resistor between a power output of a power supply and DC bias inputs of the plurality of inverting stages of the ring oscillator; and providing a voltage from the power output of the power supply to the plurality of inverting stages of the ring oscillator via the power sensing resistor; and monitoring a signal from the power sensing resistor to determine a characteristic of the ring oscillator.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
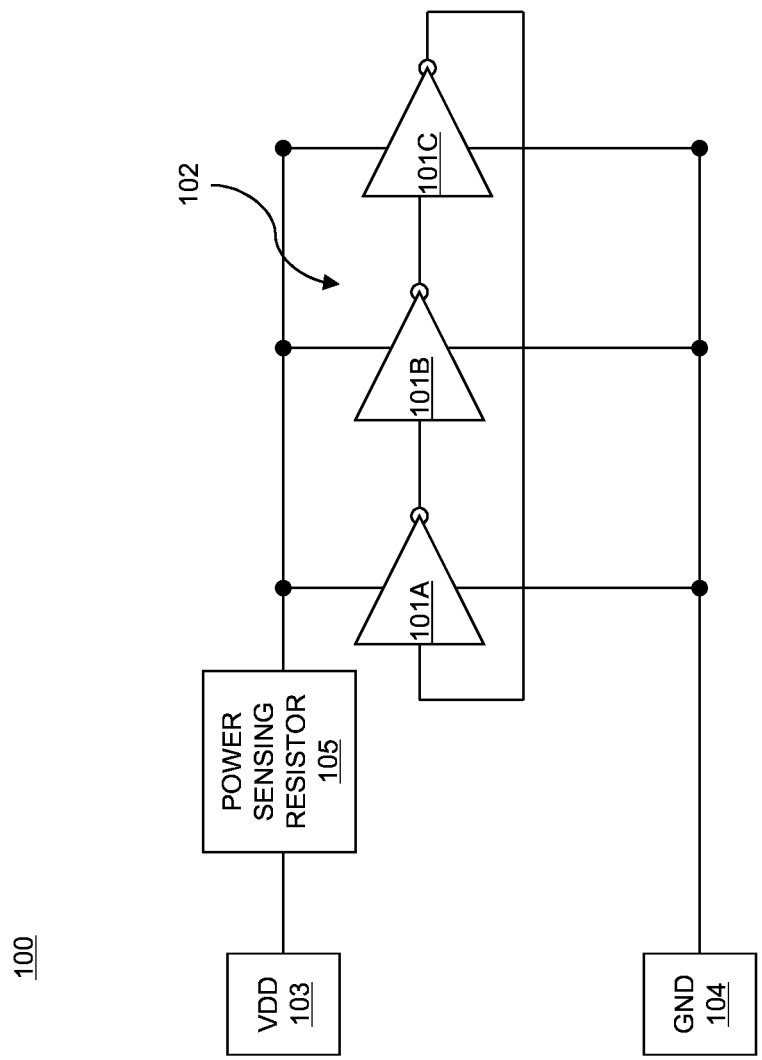
FIG. 1 is a circuit diagram illustrating an embodiment of a test circuit including a ring oscillator and a power sensing resistor.

Embodiments of systems and methods for testing of a ring oscillator with a power sensing resistor are provided, with exemplary embodiments being discussed below in detail. The power sensing resistor is located between a power supply ($V_{dd}$) of the ring oscillator and the DC bias inputs of each of the inverting stages. At state change (i.e., when the inverting stages switch from high to low, or from low to high), the inverting stages draw power from $V_{dd}$ via their respective DC bias inputs. Therefore, the signal of the voltage across, or current through, the power sensing resistor may be monitored determines the frequency of the ring oscillator, based on the power drawn from $V_{dd}$ by the inverting stages. The power sensing resistor is located outside of the ring oscillator and does not impact the loading of the ring oscillator, and therefore has a relatively small impact on the frequency of the ring oscillator, allowing accurate testing. Testing of a ring oscillator using a power sensing resistor may be used in conjunction with ring oscillators having relatively high frequencies, for example, in the gigahertz (GHz) range.

The signal from the power sensing resistor may be analyzed to determine various characteristics, such as delay performance, of the individual inverting stages of the ring oscillator, which gives additional information regarding the ring oscillator as compared to an average delay performance across all of the inverting stages that may be obtained by other testing methods. Transient data may also be determined from the power sensing resistor signal for each inverting stage, which can be used to study the history effect or device variation in, for example, silicon-on-insulator (SOI) technologies. Also, relatively accurate best and worst case analysis of the ring oscillator may be made based on the delay performance that may be determined for the individual inverting stages.

The power sensing resistor may have a relatively small resistance value, for example, from about 1 ohm to about 3 ohms in some embodiments, so that the voltage drop across the power sensing resistor may be relatively small. Accordingly, the power sensing resistor has a relatively small effect on the ring oscillator under test. In some embodiments, $V_{dd}$ may be increased to compensate for the voltage drop across the power sensing resistor, further reducing the effect of the power sensing resistor on the ring oscillator during testing.

Any appropriate electrical testing equipment may be used to monitor and analyze the signal from the power sensing resistor, which may comprise a voltage and/or a current signal. For testing of ring oscillators having relatively low oscillation frequencies (for example, lower than 10 GHz), an oscilloscope or frequency counter may be used to analyze the signal from the power sensing resistor. For testing of ring oscillators having relatively high oscillation frequencies (for example, 10 GHz or higher), a spectrum analyzer may be used to analyze the signal from the power sensing resistor. In further embodiments, a mixer or frequency divider may be used in conjunction with the oscilloscope, frequency counter, or spectrum analyzer to extend the testable frequency range.

FIG. 1 illustrates an embodiment of a test circuit 100 including a ring oscillator 102 with a power sensing resistor 105. Ring oscillator 102 includes a plurality of inverting stages 101A-C. Inverting stages 101A-C are shown for illustrative purposes only; a ring oscillator such as ring oscillator 102 may include any appropriate odd number of inverting stages in various embodiments. An output of the ring oscillator 102 is provided at the output of inverting stage 101C. The inverting stages 101A-C are each connected between $V_{dd}$ 103, via respective DC bias inputs, and ground connection 104. $V_{dd}$ 103 and ground connection 104 may be provided by a DC power supply. The inverting stages 101A-C each draw power from $V_{dd}$ 103 via their respective DC bias inputs when changing state. The power sensing resistor 105 is located between $V_{dd}$ 103 and the DC bias inputs of the inverting stages 101A-C of the ring oscillator 102. The signal of the voltage across, or current through, power sensing resistor 105 may therefore be monitored to determine the characteristics of the ring oscillator 102, as spikes may be observed in the signal from power sensing resistor 105 whenever any of inverting stages 101A-C changes state. Power sensing resistor 105 may comprise a relatively small resistor in some embodiments (for example, from about 1 ohm to about 3 ohms) and, in some embodiments, $V_{dd}$ 103 may be increased to compensate for the voltage drop across power sensing resistor 105.

Figure 2:
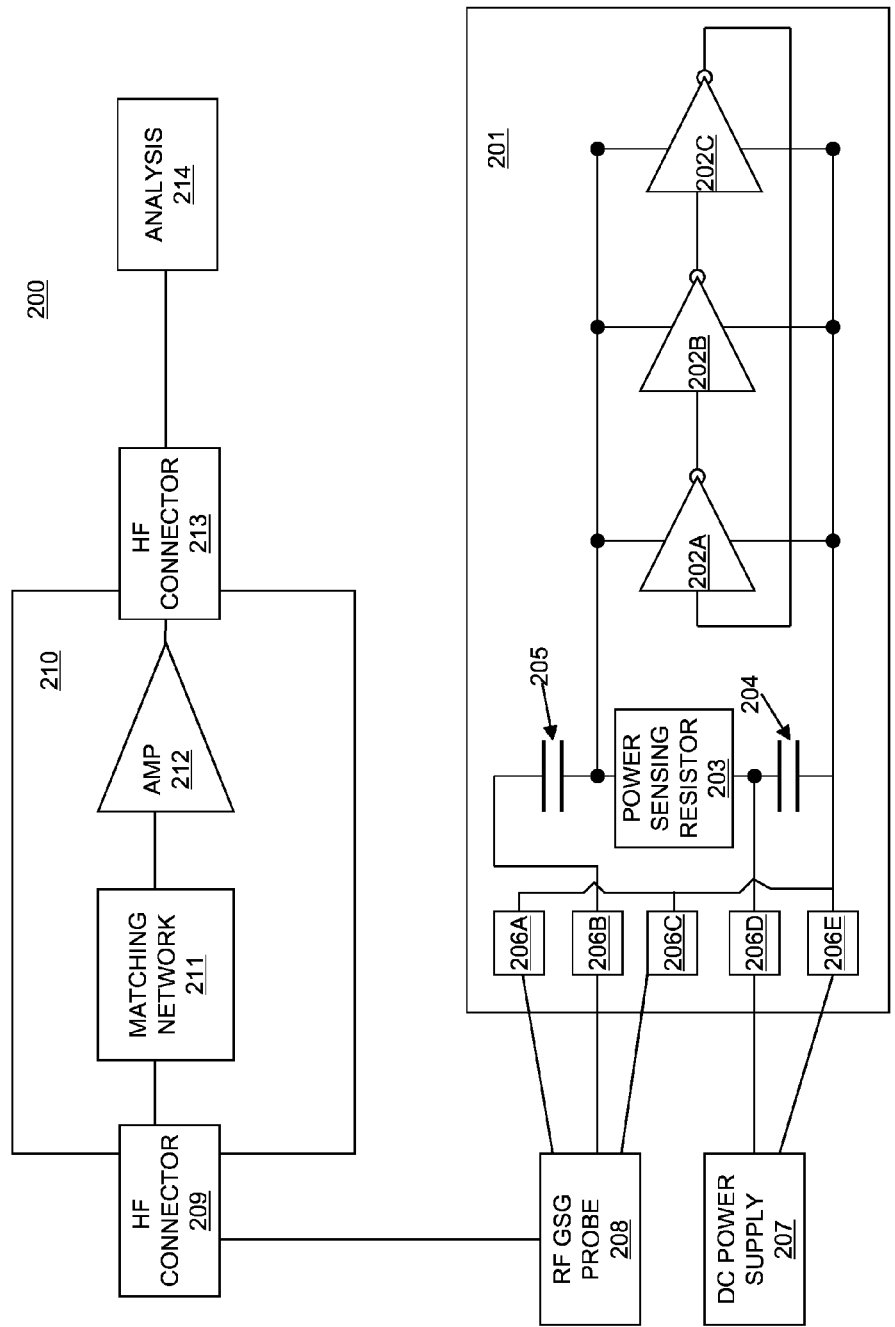
FIG. 2 is a circuit diagram illustrating another embodiment of a test circuit including a ring oscillator and a power sensing resistor.
Figure 3:
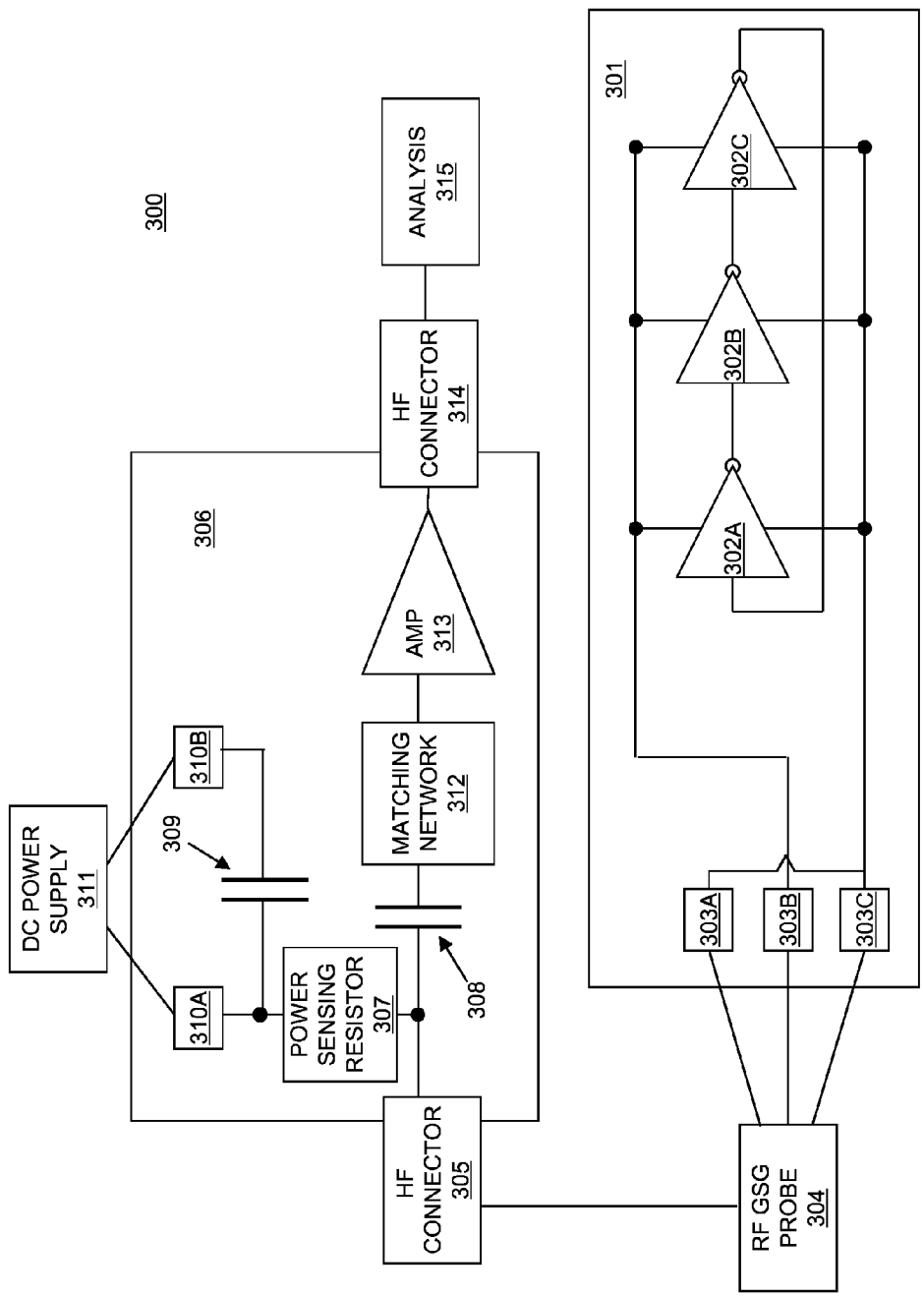
FIG. 3 is a circuit diagram illustrating another embodiment of a test circuit including a ring oscillator and a power sensing resistor.

A decoupling capacitor and a DC blocking capacitor may be used in conjunction with a power sensing resistor 105 such as is shown in FIG. 1. The decoupling capacitor is located between a node that is located between $V_{dd}$ and an input terminal of the power sensing resistor and the ground connection, so that the input terminal of the power sensing resistor is alternating current (AC) grounded. The DC blocking capacitor connects an output terminal of the power sensing resistor and a test circuit, and blocks the DC component of the signal from the power sensing resistor while transmitting the AC component for signal analysis by the test circuit. In some embodiments, the power sensing resistor, decoupling capacitor, and DC blocking capacitor may be located on the same chip as the ring oscillator, while in other embodiments, the power sensing resistor, decoupling capacitor, and DC blocking capacitor may be located on a separate printed circuit board (PCB). A probe such as a radiofrequency ground-signal-ground (RF GSG) probe may also be used in conjunction with various embodiments of a ring oscillator test circuit. FIGS. 2 and 3 show example ring oscillator test circuits 200 and 300, each including a power sensing resistor, a decoupling capacitor, a DC blocking capacitor, and a RF GSG probe; however, these test circuits are shown for illustrative purposes only. A test circuit for a ring oscillator including a power sensing resistor may have any appropriate configuration and may include any appropriate components in various embodiments.

FIG. 2 illustrates another embodiment of a test circuit 200 for a ring oscillator, including inverting stages 202A-C, with a power sensing resistor 203. Test circuit 200 includes a first module 201, which may comprise a chip, that includes ring oscillator inverting stages 202A-C, power sensing resistor 203, decoupling capacitor 204, DC blocking capacitor 205 and probing pads 206A-E. Inverting stages 202A-C are shown for illustrative purposes only; a ring oscillator may include any appropriate odd number of inverting stages in various embodiments. $V_{dd}$ is provided to the ring oscillator comprising inverting stages 202A-C by DC power supply 207 via $V_{dd}$ pad 206D, and ground is provided by DC power supply 207 via ground pad 206E. In some embodiments, the $V_{dd}$ provided by DC power supply 207 may be increased to compensate for the voltage drop across power sensing resistor 203. Decoupling capacitor 204 provides an AC ground to an input terminal of the power sensing resistor 203. Power sensing resistor 203 is located between $V_{dd}$ pad 206D and the DC bias inputs of the inverting stages 202A-C. RF GSG probe 208 is connected to signal pad 206B, ground pad 206A, and ground pad 206C. As shown in FIG. 2, ground pads 206A, 206C, and 206E may be connected to one another on the first module 201 in some embodiments.

The signal from power sensing resistor 203 is output to RF GSG probe 208 via DC blocking capacitor 205 and signal pad 206B. DC blocking capacitor 205 blocks the DC component from the power sensing resistor 203, while transmitting the AC component of the signal from the power sensing resistor 203 to signal pad 206B. RF GSG probe 208 transmits the signal received from signal pad 206B to a second module 210, which may comprise a PCB, through a radiofrequency (RF) cable. Second module 210 comprises a first high frequency (HF) connector 209, signal processing components including an impedance matching network 211 and amplifier 212, and a second HF connector 213 that transmits the processed signal to analysis block 214. Analysis block 214 may comprise any appropriate electronics for analyzing the processed signal received from second module 210, such as an oscilloscope, a frequency counter, or a spectrum analyzer, in various embodiments, and may additionally comprise a mixer or frequency divider in some embodiments. The analysis block 214 may determine the frequency of the ring oscillator comprising inverting stages 202A-C, and the delays of the individual inverting stages 202A-C, based on spikes that may be observed in the signal received from the second module 210.

FIG. 3 illustrates another embodiment of a test circuit 300 for a ring oscillator, including inverting stages 302A-C, with a power sensing resistor 307. Test circuit 300 includes a first module 301, which may comprise a chip, that includes ring oscillator inverting stages 302A-C and pads 303A-C. Inverting stages 302A-C are shown for illustrative purposes only; a ring oscillator may include any appropriate odd number of inverting stages in various embodiments. RF GSG probe 304 is connected to first module 301 via signal pad 303B and ground pads 303A and 303C. Ground pads 303A and 303C may be connected to each other on the first module 301 in some embodiments. Inverting stages 302A-C are each connected between signal pad 303B, which provides $V_{dd}$ to each of inverting stages 302A-C via their respective DC bias inputs, and ground pad 303C.

The RF GSG probe 304 receives $V_{dd}$ from DC power supply 311 via second module 306, which may comprise a PCB. Second module 306 includes a first HF connector 305, which is connected to RF GSG probe 304. Second module 306 further includes power sensing resistor 307, decoupling capacitor 309, DC blocking capacitor 308, and pads 310A-B. $V_{dd}$ is provided by DC power supply 311 via $V_{dd}$ pad 310A, and a ground connection is provided by DC power supply 311 via ground pad 310B. Power sensing resistor 307 is therefore located between $V_{dd}$ pad 310A and the inverting stages 302A-C of the ring oscillator. In some embodiments, the $V_{dd}$ provided by DC power supply 311 may be increased to compensate for the voltage drop across power sensing resistor 307. Decoupling capacitor 309 provides an AC ground at an input terminal of power sensing resistor 307. DC blocking capacitor 308 blocks the DC component of the signal from the power sensing resistor 307, while transmitting the AC component of the signal from the power sensing resistor 307 to signal processing elements including impedance matching network 312 and amplifier 313. The processed signal from the power sensing resistor 307 is then output from second module 306 via second HF connector 314 to analysis block 315. Analysis block 315 may comprise any appropriate electronics for analyzing the processed signal received from second module 306, such as an oscilloscope, a frequency counter, or a spectrum analyzer, in various embodiments, and may additionally comprise a mixer or frequency divider in some embodiments. The analysis block 315 may determine the frequency of the ring oscillator comprising inverting stages 302A-C, and the delays of the individual inverting stages 302A-C, based on spikes that may be observed in the signal received from the second module 306.

Figure 4:
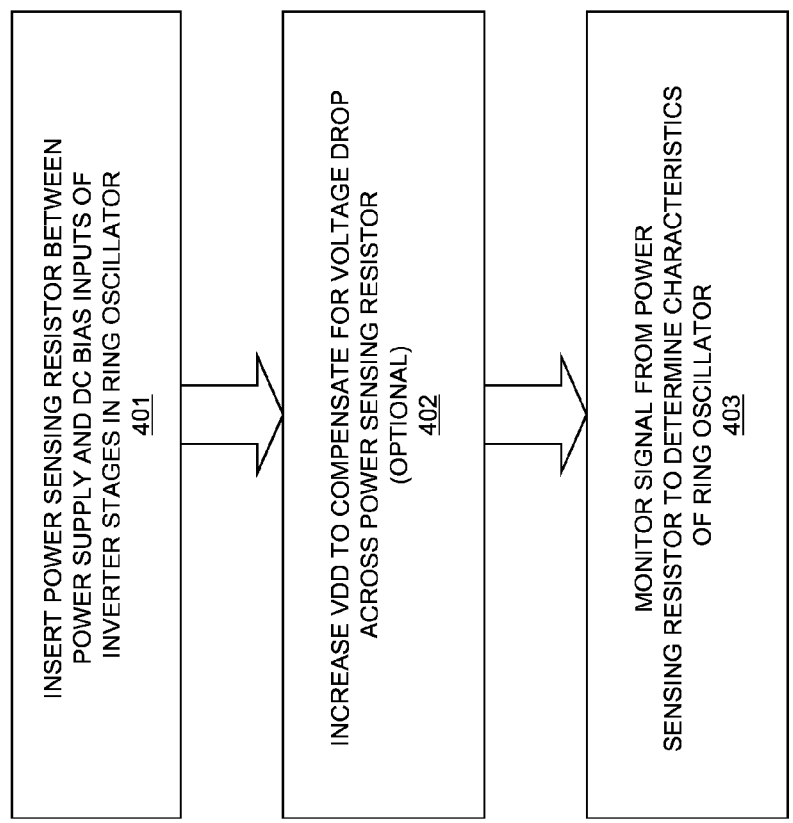
FIG. 4 is a flowchart illustrating an embodiment of a method of testing a ring oscillator using a power sensing resistor.

FIG. 4 illustrates a flowchart of an embodiment of a method 400 of testing a ring oscillator using a power sensing resistor. First, in block 401, a power sensing resistor (for example, power sensing resistor 105 of FIG. 1, power sensing resistor 203 of FIG. 2, or power sensing resistor 307 of FIG. 3) is provided in between a power supply and the DC bias inputs of the inverting stages of a ring oscillator. Next, in optional block 402, the $V_{dd}$ provided to the ring oscillator by the power supply may be increased to compensate for the voltage drop across the power sensing resistor so that the voltage bias or current bias at the ring oscillator inverting stages in the presence of the power sensing resistor is about the same as compared to the voltage bias or current bias of a ring oscillator without the power sensing resistor. In some embodiments, block 402 of method 400 may be omitted. Lastly, in block 403, a signal, which may comprise a voltage and/or a current signal, from the power sensing resistor is monitored to determine the characteristics, such as frequency and/or stage delays, of the ring oscillator. Spikes in the signal indicate a change of state by an inverting stage of the ring oscillator, and these spikes may be analyzed to determine the ring oscillator characteristics.

Figure 5:
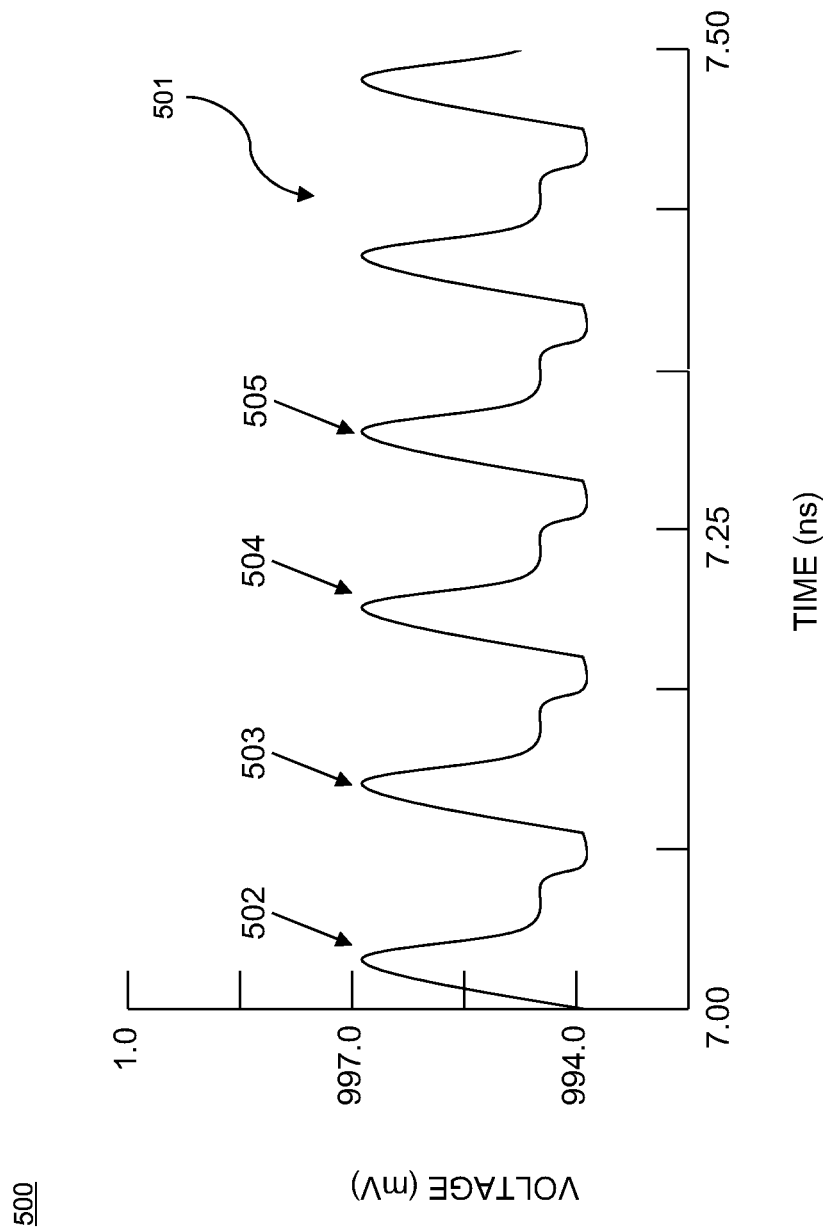
FIG. 5 is a graph illustrating an embodiment of a voltage signal across a power sensing resistor as a function of time during testing of a ring oscillator.

FIG. 5 is a graph 500 illustrating an example of a waveform 501 of a voltage signal from a power sensing resistor as a function of time during testing of a ring oscillator. A waveform such as waveform 501 may be obtained using any of the test circuits 100, 200, or 300 that were shown above with respect to FIGS. 1-3. The sequential spikes 502-505 each comprise a draw of power from $V_{dd}$ by an individual inverting stage of the ring oscillator under test that occurs when an inverting stage changes state. Therefore, the time between spikes 502 and 503 may give a stage delay of a first inverting stage of the ring oscillator; the time between spikes 503 and 504 may give a stage delay of a second inverting stage of the ring oscillator; and the time between spikes 504 and 505 may give a stage delay of a third inverting stage of the ring oscillator. While it is not possible to assign these stage delays to particular inverting stages of the ring oscillator under test based on a waveform such as waveform 501, it is possible to determine if, for example, one of the inverting stages of the ring oscillator has an unacceptably long stage delay, indicating that the ring oscillator is faulty.

The technical effects and benefits of exemplary embodiments include testing of a ring oscillator with relatively low impact on the operation of the ring oscillator by the testing circuit.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A test circuit for a ring oscillator comprising a plurality of inverting stages, the test circuit comprising:
    a power supply, the power supply configured to provide a voltage to the plurality of inverting stages of the ring oscillator at a power output of the power supply;
    a power sensing resistor located between the power output of the power supply and direct current (DC) bias inputs of the plurality of inverting stages of the ring oscillator, wherein an input terminal of the power sensing resistor is connected to the power supply, and an output terminal of the power sensing resistor is connected to the DC bias inputs of the plurality of inverting states of the ring oscillator; and
    a signal processing circuit that is configured to:
        monitor one of a voltage across and a current through the power sensing resistor; and
        determine a respective stage delay of each of the plurality of inverting stages of the ring oscillator based on the monitoring of one of the voltage across and current through the power sensing resistor;
    a decoupling capacitor located between the input terminal of the power sensing resistor and a ground connection of the power supply; and
    a DC blocking capacitor located between the output terminal of the power sensing resistor and the signal processing circuit, wherein the one of the voltage across and the current through the power sensing resistor is provided to the signal processing circuit from the output terminal of the power sensing resistor via the DC blocking capacitor.

2. The test circuit of claim 1, wherein the voltage provided by the power supply is configured to compensate for a voltage drop across the power sensing resistor.

3. The test circuit of claim 1, wherein the ring oscillator is located on a chip, and wherein the decoupling capacitor, the DC blocking capacitor, the power sensing resistor, and the signal processing circuit are located on a printed circuit board (PCB).

4. The test circuit of claim 3, wherein the chip comprises a signal pad and two ground pads for connecting to a radio frequency ground-signal-ground (RF GSG) probe, and wherein the voltage from the power output of the power supply is provided from the printed circuit board (PCB) via the RF GSG probe and the signal pad to the ring oscillator on the chip.

5. The test circuit of claim 4, wherein the PCB comprises a ground pad for connection to the ground connection of the power supply and a power input pad for connection to the power output of the power supply, wherein the power sensing resistor is located between the power input pad and the RF GSG probe, and wherein one of the voltage across and the current through the power sensing resistor is transmitted via the DC blocking capacitor to the signal processing circuit on the PCB.

6. The test circuit of claim 1, wherein the signal processing circuit comprises a matching network connected in series with an amplifier, and wherein an output of the signal processing circuit is connected to one of an oscilloscope, a frequency counter, and a spectrum analyzer.

7. The test circuit of claim 1, wherein the input terminal of the power sensing resistor is directly coupled to the decoupling capacitor, and wherein the output terminal of the power sensing resistor is directly coupled to the DC blocking capacitor.

8. The test circuit of claim 1, wherein the decoupling capacitor, DC blocking capacitor, the power sensing resistor and the ring oscillator are located on a chip, wherein the signal processing circuit is located on a printed circuit board (PCB), wherein the chip comprises a ground pad for connection to the ground connection of the power supply, a power input pad for connection to the power output of the power supply, and a signal pad and two ground pads for connection to a radiofrequency ground-signal-ground (RF GSG) probe, wherein the signal from the power sensing resistor is transmitted via the DC blocking capacitor, the signal pad, and the RF GSG probe to the signal processing circuit on the PCB.

9. A method of testing a ring oscillator comprising a plurality of inverting stages, the method comprising:
   connecting a power sensing resistor between a power output of a power supply and direct current (DC) bias inputs of the plurality of inverting stages of the ring oscillator, wherein an input terminal of the power sensing resistor is connected to the power supply, and an output terminal of the power sensing resistor is connected to the DC bias inputs of the plurality of inverting states of the ring oscillator;
   connecting a decoupling capacitor between the input terminal of the power sensing resistor and a ground connection of the power supply;
   connecting a DC blocking capacitor between the output terminal of the power sensing resistor and a signal processing circuit;
   providing a voltage from the power output of the power supply to the plurality of inverting stages of the ring oscillator via the power sensing resistor;
   monitoring, by the signal processing circuit, one of a voltage across and a current through the power sensing resistor, wherein the one of the voltage across and the current through the power sensing resistor is provided to the signal processing circuit from the output terminal of the power sensing resistor via the DC blocking capacitor; and determining, by the signal processing circuit, a respective stage delay of each of the plurality of inverting stages of the ring oscillator based on the monitoring of one of the voltage across and current through the power sensing resistor.

10. The method of claim 9, further comprising increasing the voltage provided by the power supply to compensate for a voltage drop across the power sensing resistor.

11. The method of claim 9, wherein the ring oscillator is located on a chip, and wherein the decoupling capacitor, the DC blocking capacitor, the power sensing resistor, and the signal processing circuit are located on a printed circuit board (PCB).

12. The method of claim 11, further comprising:
   connecting a signal pad and two ground pads of the chip to a radio frequency ground-signal-ground (RF GSG) probe, wherein the voltage from the power output of the power supply is provided from the PCB via the RF GSG probe and the signal pad to the ring oscillator on the chip.

13. The method of claim 12, wherein providing the voltage from the power output of the power supply to the plurality of inverting stages of the ring oscillator via the power sensing resistor comprises:
   connecting a ground pad of the PCB to the ground connection of the power supply; and
   connecting a power input pad of the PCB to the power output of the power supply, wherein the power sensing resistor is located between the power input pad and the RF GSG probe; and further comprising:
   transmitting one of the voltage across and the current through the power sensing resistor via the DC blocking capacitor to the signal processing circuit on the PCB.

14. The method of claim 9, wherein the signal processing circuit comprises a matching network connected in series with an amplifier, and wherein an output of the signal processing circuit is provided to one of an oscilloscope, a frequency counter, and a spectrum analyzer to determine the characteristic of the ring oscillator.

15. The method of claim 9, wherein the input terminal of the power sensing resistor is directly coupled to the decoupling capacitor, and wherein the output terminal of the power sensing resistor is directly coupled to the DC blocking capacitor.

16. The method of claim 9, wherein the decoupling capacitor, DC blocking capacitor, the power sensing resistor, and the ring oscillator are located on a chip, and wherein the signal processing circuit is located on a printed circuit board (PCB), and wherein providing the voltage from the power output of the power supply to the plurality of inverting stages of the ring oscillator via the power sensing resistor comprises:
   connecting a ground pad of the chip to a ground connection of the power supply; and
   connecting a power input pad of the chip to the power output of the power supply; and further comprising:
   connecting a signal pad and two ground pads of the chip to a radiofrequency ground-signal-ground (RF GSG) probe, wherein the signal from the power sensing resistor is transmitted via the DC blocking capacitor, the signal pad, and the RF GSG probe to the signal processing circuit on the PCB.

* * * * *